US008143098B2

(12) United States Patent
Do et al.

(10) Patent No.: US 8,143,098 B2
(45) Date of Patent: Mar. 27, 2012

(54) INTEGRATED CIRCUIT PACKAGING SYSTEM WITH INTERPOSER AND METHOD OF MANUFACTURE THEREOF

(75) Inventors: Byung Tai Do, Singapore (SG); Linda Pei Ee Chua, Singapore (SG); Sharon Ooi, Singapore (SG); Reza Argenty Pagaila, Singapore (SG)

(73) Assignee: Stats Chippac Ltd., Singapore (SG)

( * ) Notice: Subject to any disclaimer, the term of this patent is extended or adjusted under 35 U.S.C. 154(b) by 306 days.

(21) Appl. No.: 12/411,040

(22) Filed: Mar. 25, 2009

(65) Prior Publication Data
US 2010/0244024 A1    Sep. 30, 2010

(51) Int. Cl.
*H01L 21/00* (2006.01)
(52) U.S. Cl. .......................... 438/108; 438/109; 257/48
(58) Field of Classification Search .................. 257/48; 438/108, 109
See application file for complete search history.

(56) References Cited

U.S. PATENT DOCUMENTS

| | | | |
|---|---|---|---|
| 5,258,648 A | 11/1993 | Lin | |
| 5,942,798 A | 8/1999 | Chiu | |
| 6,034,426 A * | 3/2000 | Patel et al. | 257/698 |
| 6,239,484 B1 | 5/2001 | Dore et al. | |
| 6,448,664 B1 * | 9/2002 | Tay et al. | 257/780 |
| 6,489,557 B2 | 12/2002 | Eskildsen et al. | |
| 6,522,018 B1 | 2/2003 | Tay et al. | |
| 7,064,426 B2 | 6/2006 | Karnezos | |
| 7,253,511 B2 | 8/2007 | Karnezos et al. | |
| 7,400,134 B2 * | 7/2008 | Morishita et al. | 324/762.02 |
| 2006/0097402 A1 | 5/2006 | Pu et al. | |
| 2009/0283888 A1 * | 11/2009 | Choi et al. | 257/686 |

* cited by examiner

*Primary Examiner* — Phat X Cao
(74) *Attorney, Agent, or Firm* — Mikio Ishimaru

(57) ABSTRACT

A method of manufacture of an integrated circuit packaging system includes: providing an interposer having device contacts, interconnect contacts, and test pads including the interconnect contacts along an interconnect perimeter region of the interposer, the device contacts at a device perimeter region of the interposer with the device perimeter region within the interior of the interconnect perimeter region, and the test pads at a test perimeter region of the interposer with the test perimeter region encompassing the device perimeter region; and mounting an integrated circuit over the device contacts.

13 Claims, 10 Drawing Sheets

INTEGRATED CIRCUIT PACKAGING SYSTEM WITH INTERPOSER AND METHOD OF MANUFACTURE THEREOF

TECHNICAL FIELD

The present invention relates generally to an integrated circuit packaging system and more particularly to an integrated circuit packaging system with an interposer.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made using the semiconductor package structures. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Different challenges arise from increased functionality integration and miniaturization. For example, a semiconductor product having increased functionality may be made smaller but may still be required to provide a large number of inputs/outputs (I/O). The semiconductor product also needs to be readily testable while still providing smaller size. Further, increased performance of semiconductor product put additional challenges on the semiconductor product during test and in the field.

Thus, a need still remains for an integrated circuit packaging system providing low cost manufacturing, improved yield, improved reliability, and improved testability. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including providing an interposer having device contacts, interconnect contacts, and test pads including the interconnect contacts along an interconnect perimeter region of the interposer, the device contacts at a device perimeter region of the interposer with the device perimeter region within the interior of the interconnect perimeter region, and the test pads at a test perimeter region of the interposer with the test perimeter region encompassing the device perimeter region; and mounting an integrated circuit over the device contacts.

The present invention provides an integrated circuit packaging system including an interposer having device contacts, interconnect contacts, and test pads including the interconnect contacts along an interconnect perimeter region of the interposer, the device contacts at a device perimeter region of the interposer with the device perimeter region within the interior of the interconnect perimeter region, and the test pads at a test perimeter region of the interposer with the test perimeter region encompassing the device perimeter region; and an integrated circuit over the device contacts.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
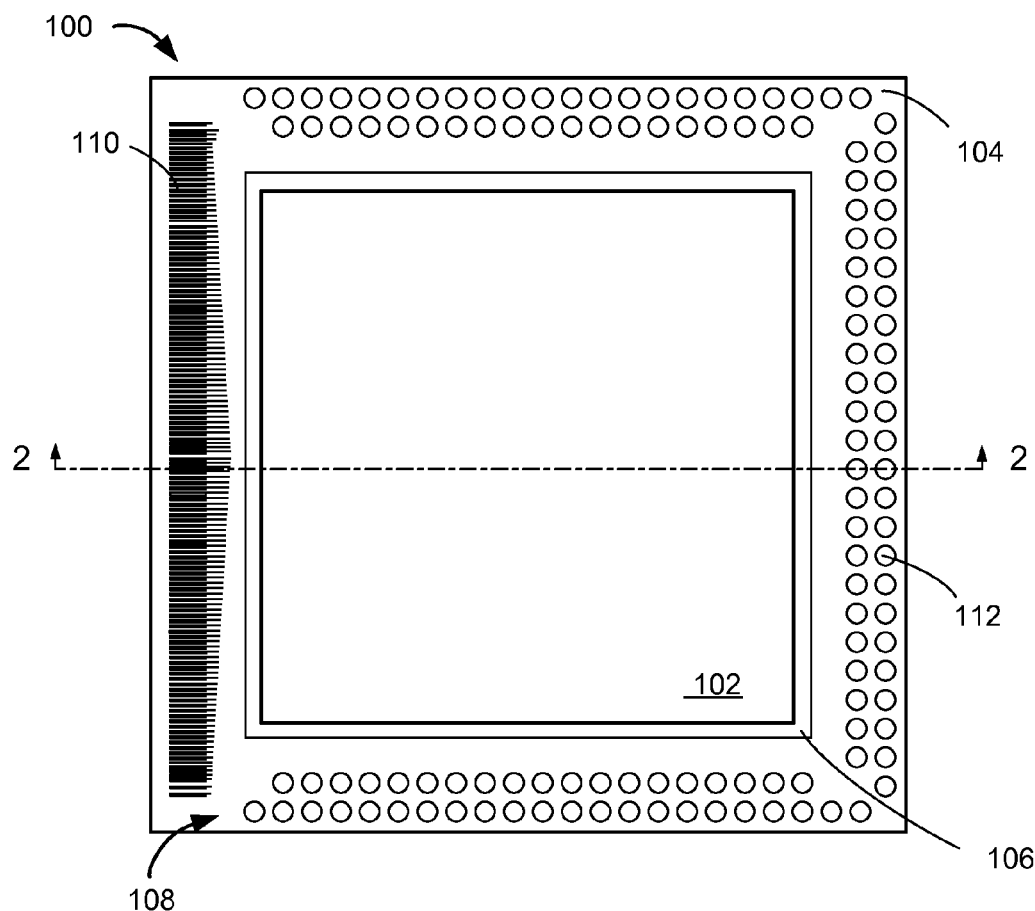
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Similarly, although the views in the drawings for ease of description generally show similar orientations, this depiction in the FIGs. is arbitrary for the most part. Generally, the invention can be operated in any orientation. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane.

The term "on" means there is direct contact among elements. The term "processing" as used herein includes deposition of material, patterning, exposure, development, etching, cleaning, molding, and/or removal of the material or as required in forming a described structure.

Referring now to FIG. 1, therein is shown a top view of an integrated circuit packaging system 100 in a first embodiment of the present invention. The top view depicts an integrated circuit 102, such as a flip chip or a packaged integrated circuit device, mounted over an interposer 104, such as a laminated substrate or a carrier, with an underfill 106 in between. The interposer 104 includes a first side 108 having a row of interconnect contacts 110 and rows of test pads 112.

Figure 2:
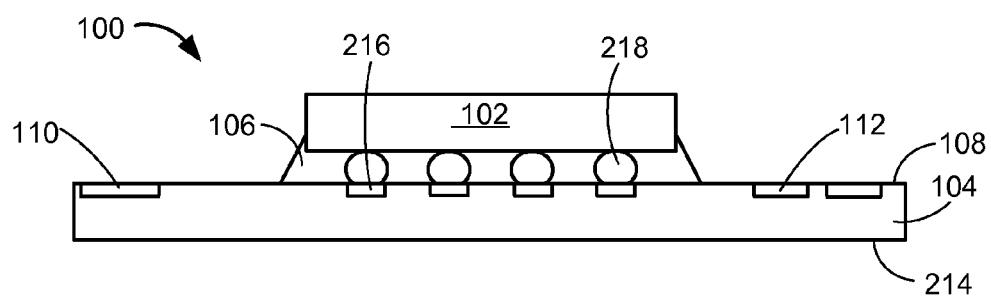
FIG. 2 is a cross-sectional view of the integrated circuit packaging system along line 2-2 of FIG. 1.

Referring now to FIG. 2, therein is shown a cross-sectional view of the integrated circuit packaging system 100 along line 2-2 of FIG. 1. The integrated circuit packaging system 100 includes the interposer 104 having the first side 108 and a second side 214. The first side 108 can include device contacts 216, the interconnect contacts 110, and the test pads 112.

The interconnect contacts 110 are sized to provide surface areas for reliable connection. For example, the surface area of each of the interconnect contacts 110 are sufficiently large for robust and reliable wire bonding onto the interconnect contacts 110.

The device contacts 216 are sized to provide sufficient large surface areas for electrical connectors 218, such as solder bumps or connective bumps, to attach to the device contacts 216 while small enough to provide the density of interconnects or input/outputs (I/O) of the integrated circuit 102. The device contacts 216 are preferably smaller than the interconnect contacts 110.

The test pads 112 can be formed to withstand repeated test connection impact forces. For example, the test pads 112 can be formed with multiple layers of conductive layers of similar or different materials. The test pads 112 can also be formed with lower resistive material than the device contacts 216 and the interconnect contacts 110. For example, the test pads 112 can be formed with gold (Au) while the device contacts 216 and the interconnect contacts 110 can be formed with copper (Cu).

The integrated circuit 102 can be mounted over the interposer 104 with electrical connectors 218, such as solder bumps or conductive bumps. The electrical connectors 218 can connect to the device contacts 216. The underfill 106 can be between the integrated circuit 102 and the interposer 104. The underfill 106 can surround the electrical connectors 218.

For illustrative purposes, the integrated circuit packaging system 100 is shown with the integrated circuit 102 mounted over the first side 108, although it is understood that the integrated circuit packaging system 100 can have different devices mounted over the first side 108. For example, the other integrated circuits or passive devices can be mounted to the first side 108 adjacent to the integrated circuit 102.

Figure 3:
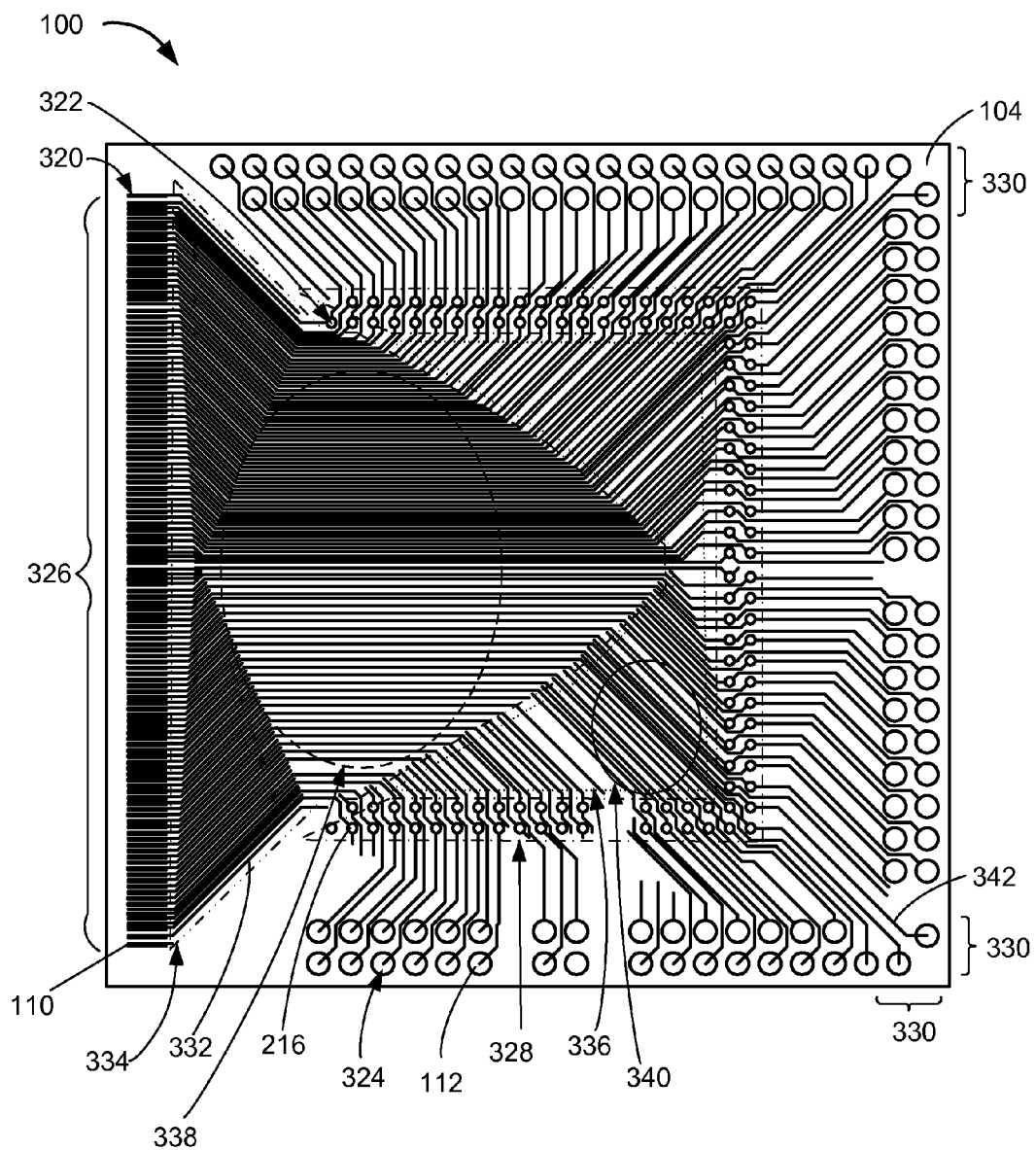
FIG. 3 is a top plan view of the integrated circuit packaging system of FIG. 1.

Referring now to FIG. 3, therein is shown a top plan view of the integrated circuit packaging system 100 of FIG. 1. The top plan view depicts the integrated circuit packaging system 100 without the integrated circuit 102 of FIG. 2, the underfill 106 of FIG. 2, and the electrical connectors 218 of FIG. 2. The interposer 104 can have interconnect sites 320, device sites 322, and test sites 324. For clarity, only a portion of the interconnect sites 320, the device sites 322, and the test sites 324 are shown.

The interposer 104 can have an equal number of the interconnect sites 320, the device sites 322, and the test sites 324. The interconnect sites 320 can be populated for providing the interconnect contacts 110. If one or a portion of the interconnect sites 320 are not populated, then the corresponding one to a portion of the interconnect contacts 110 would be absent at those corresponding locations of the interconnect sites 320.

The device sites 322 can be populated for providing the device contacts 216. If one or a portion of the device sites 322 are not populated, then the corresponding one to a portion of the device contacts 216 would be absent at those corresponding locations of the device sites 322.

The test sites 324 can be populated for providing the test pads 112. If one or a portion of the test sites 324 are not populated, then the corresponding one to a portion of the test pads 112 would be absent at those corresponding locations of the test sites 324.

The interposer 104 can have at least a portion of the interconnect sites 320, the device sites 322, and the test sites 324 populated with the interconnect contacts 110, the device contacts 216, and the test pads 112, respectively. For clarity, only a portion of the interconnect contacts 110, the device contacts 216, and the test pads 112 are shown.

The interposer 104 can have an interconnect perimeter region 326, a device perimeter region 328, as depicted by the area surrounded by the dash-dot-dash region, and a test perimeter region 330. The interconnect sites 320 can be at the interconnect perimeter region 326 of the interposer 104. The interconnect sites 320 and the interconnect contacts 110 can be arranged in a row.

For illustrative purposes, the integrated circuit packaging system 100 is shown with one row of the interconnect contacts 110, although it is understood that the integrated circuit packaging system 100 can have a different configuration of the interconnect contacts 110 and interconnect sites 320. For example, the interconnect sites 320 may not be all populated with the interconnect contacts 110. Another example, the interconnect sites 320, the interconnect contacts 110, or a combination thereof can be in more than one row in a staggered or non-staggered configuration.

The device sites 322 can be at the device perimeter region 328 of the interposer 104. The device perimeter region 328 can be within the interior of the interconnect perimeter region 326. The device sites 322 can be arranged in two rows.

For illustrative purposes, the integrated circuit packaging system 100 is shown with two rows of the device sites 322 and the device contacts 216, although it is understood that the integrated circuit packaging system 100 can have a different configuration of the device sites 322 and the device contacts 216. For example, the device sites 322 may not be all populated with the device contacts 216. Another example, the device sites 322, the device contacts 216, or a combination thereof can be in one row or more than two rows in a staggered or non-staggered configuration.

The test sites 324 can be at the test perimeter region 330 of the interposer 104. The test perimeter region 330 can encompass the device perimeter region 328 of the interposer. The device sites 322 can be arranged in rows.

For illustrative purposes, the integrated circuit packaging system 100 is shown with two rows of the test sites 324 and the test pads 112, although it is understood that the integrated circuit packaging system 100 can have a different configuration of the test sites 324 and the test pads 112. For example, the test sites 324 may not be all populated with the test pads 112. Another example, the test sites 324, the test pads 112, or a combination thereof can be in one row or more than two rows in a staggered or non-staggered configuration.

The interposer 104 can include terminal embedded interconnects 332, such as a routing traces or other conductive lines, in a first region 334, as depicted by a dash-dot-dot-dash region, and in a second region 336, as depicted by a dotted region, of the interposer 104. For clarity, only a portion of the terminal embedded interconnects 332 are shown. The terminal embedded interconnects 332 can connect the interconnect contacts 110 and the device contacts 216. The first region 334 can have a first density 338, as depicted by a dashed oval, of the terminal embedded interconnects 332.

The second region 336 can have a second density 340, as depicted by a solid oval, of the terminal embedded interconnects 332. The first density 338 can be greater than the second density 340.

The terminal embedded interconnects 332 in the first region 334 converges from the interconnect contacts 110 toward the boundary to the second region 336. For example, the boundary between the first region 334 and the second region 336 is shown within the device perimeter region 328. The terminal embedded interconnects 332 fans out from the first region 334 into the second region 336.

The interposer 104 can have test embedded interconnects 342, such as routing traces or other conductive lines. For clarity, only a portion of the test embedded interconnects 342 are shown. The test embedded interconnects 342 can connect the device contacts 216 and the test pads 112. The test embedded interconnects 342 can fan out from the device perimeter region 328 to the test perimeter region 330.

It has been discovered that the present invention provides the integrated circuit packaging system supporting high input/output (I/O) density, external connectivity, and reliable test pads. The location of the device contacts supports the high count and high density I/O of the integrated circuit of FIG. 2. The interconnect contacts enables robust connections to the integrated circuit packaging system at the periphery of the interposer. The test pads has a lower density compared to the device contacts as well as being larger than the device contacts for reliable, low cost test probe contacts. This helps ensure known good device (KGD) by testing the integrated circuit packaging system with the test pads.

It has also been discovered that the present invention provides the integrated circuit packaging system with a thin profile by eliminating encapsulation over the first integrated circuit. Eliminating molding process reduces cost and shortens cycle time. Eliminating molding can also provide an ultra thin package for numerous applications, such as an internal stacking component in a package-in-package (PIP) system module.

It has further been discovered that the present invention provides the integrated circuit packaging system having a lower profile, low cost, and reliable interposer. The device contacts, the interconnect contacts, and the test pads are exposed only on the first side of the interposer enables the interposer to be implemented as a single layer laminated substrate or printed circuit board thereby reducing complexity and thickness, increasing reliability, and saving cost.

Figure 4:
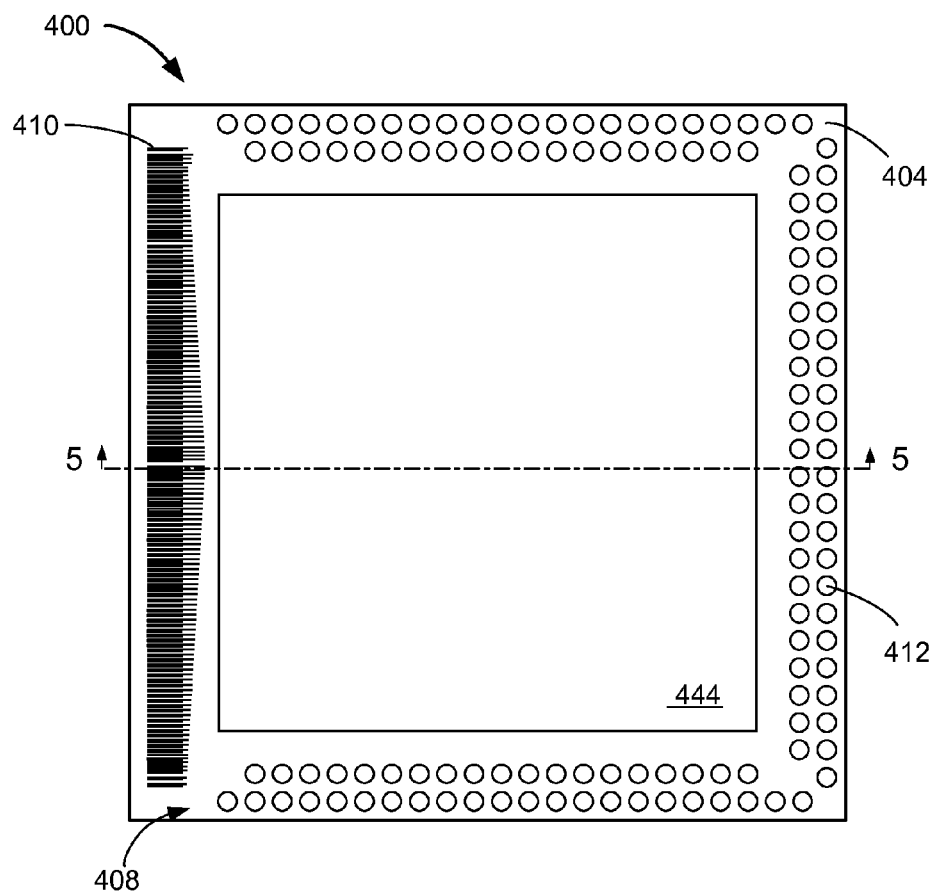
FIG. 4 is a top view of an integrated circuit packaging system in a second embodiment of the present invention.

Referring now to FIG. 4, therein is show a top view of an integrated circuit packaging system 400 in a second embodiment of the present invention. The top view depicts a covering structure 444, such as an encapsulation including an epoxy molding compound, over an interposer 404. The interposer 404 includes a first side 408 having interconnect contacts 410 and test pads 412.

Figure 5:
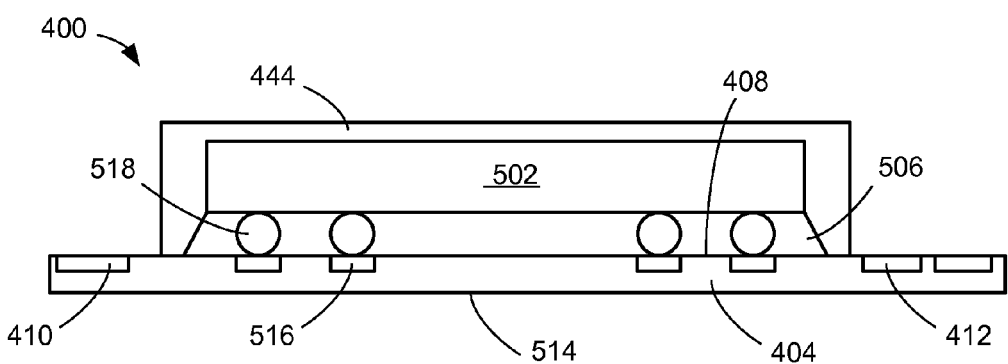
FIG. 5 is a cross-sectional view of the integrated circuit packaging system along line 5-5 of FIG. 4.

Referring now to FIG. 5, therein is shown a cross-sectional view of the integrated circuit packaging system 400 along line 5-5 of FIG. 4. The integrated circuit packaging system 400 includes the interposer having the first side 408 and a second side 514. The first side 408 can include device contacts 516, the interconnect contacts 410, and the test pads 412.

An integrated circuit 502, such as flip chip, can be mounted over the interposer 404 with an underfill 506 between. Electrical connectors 518, such as solder bumps or conductive bumps, can connect the integrated circuit 502 and the interposer 404. The electrical connectors 518 can connect to the device contacts 516.

The covering structure 444 can be over the interposer 404 and can cover the underfill 506, the integrated circuit 502, and the underfill 506. The covering structure 444 does not cover the interconnect contacts 410 or the test pads 412.

For illustrative purposes, the integrated circuit packaging system 400 is shown with the underfill 506 between the interposer 404 and the integrated circuit 502, although, it is understood that the underfill 506 is optional. For example, the covering structure 444 can be between the interposer 404 and the integrated circuit 502 and around the electrical connectors 518, forming a molded underfill.

Figure 6:
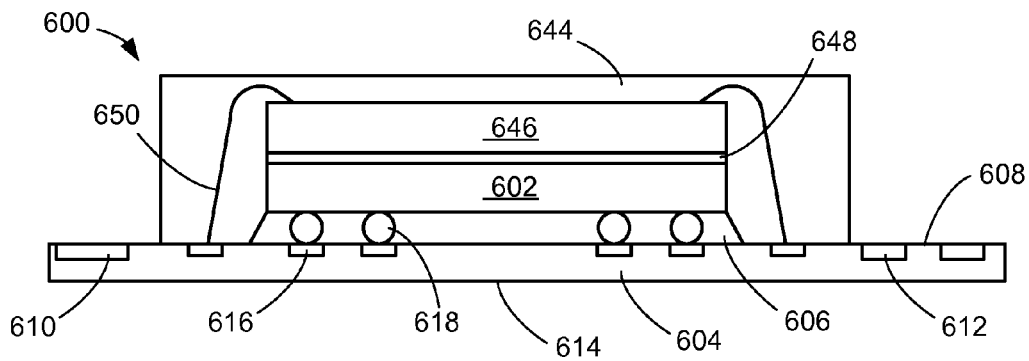
FIG. 6 is a cross-sectional view of an integrated circuit packaging system along line 5-5 of FIG. 4 in a third embodiment of the present invention.

Referring now to FIG. 6, therein is show a cross-sectional view of an integrated circuit packaging system 600 along line 5-5 of FIG. 4 in a third embodiment of the present invention. The cross-sectional view depicts an integrated circuit 602, such as a flip chip, mounted over a first side 608 of an interposer 604, such as a laminated substrate, with an underfill 606 in between.

The interposer 604 includes the first side 608 and a second side 614. The first side 608 can have interconnect contacts 610, device contacts 616, and test pads 612 exposed at the first side 608 of the interposer 604. The integrated circuit 602 can be connected to the device contacts 616 with electrical connectors 618, such as solder bumps or conductive bumps.

A device 646, such as an integrated circuit die, can be mounted over the integrated circuit 602 with an adhesive 648, such as adhesive film, in between. Internal interconnects 650, such as a bond wire or ribbon bond wire, can connect the device 646 and the interposer 604.

A covering structure 644, such as an encapsulation including an epoxy molding compound, can be over the interposer 604 and can cover the underfill 606, the integrated circuit 602, the adhesive 648, the device 646, and the internal interconnect 650. The covering structure 644 does not cover the interconnect contacts 610 or the test pads 612.

Figure 7:
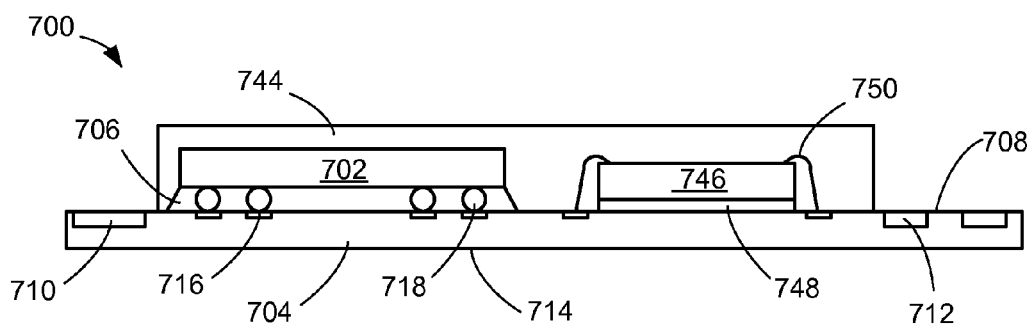
FIG. 7 is a cross-sectional view of an integrated circuit packaging system along line 5-5 of FIG. 4 in a fourth embodiment of the present invention.

Referring now to FIG. 7, therein is show a cross-sectional view of an integrated circuit packaging system 700 as along line 5-5 of FIG. 4 in a fourth embodiment of the present invention. The cross-sectional view depicts an integrated circuit 702, such as a flip chip, and a device 746, such as an integrated circuit die, mounted over a first side 708 of an interposer 704, such as a laminated substrate. The device 746 can be mounted adjacent to the integrated circuit 702.

The interposer 704 includes the first side 708 and a second side 714. The first side 708 can have interconnect contacts 710, device contacts 716, and test pads 712 exposed at the first side 708 of the interposer 704. The integrated circuit 702 can be connected to the device contacts 716 with electrical connectors 718, such as solder bumps or conductive bumps. An underfill 706, can be between the integrated circuit 702 and interposer 704 and around the electrical connectors 718.

The device 746 can be mounted over the interposer 704 with an adhesive 748, such as an adhesive film, in between. Internal interconnects 750, such as a bond wire or a ribbon bond wire, can connect the device 746 and the interposer 704.

A covering structure 744, such as an encapsulation including an epoxy molding compound, can be over the interposer 704 and can cover the integrated circuit 702, the underfill 706, the device 746, and the internal interconnects 750. The covering structure 744 does not cover the interconnect contacts 710 or the test pads 712.

Figure 8:
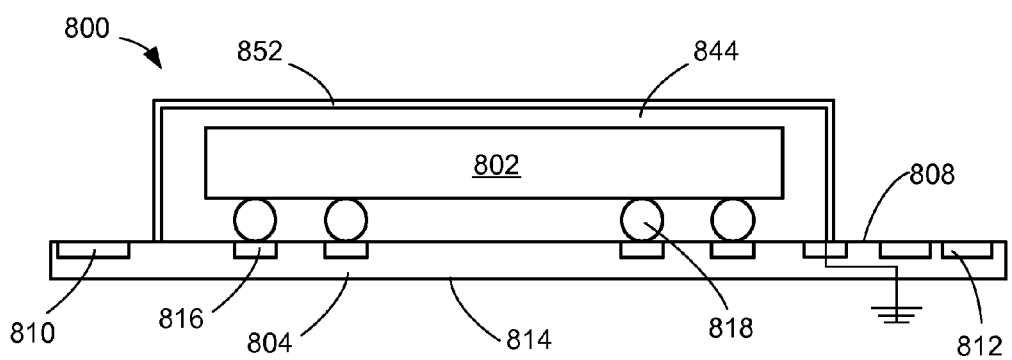
FIG. 8 is a cross-sectional view of an integrated circuit packaging system along line 5-5 of FIG. 4 in a fifth embodiment of the present invention.

Referring now to FIG. 8, therein is show a cross-sectional view of the integrated circuit packaging system 700 along line 5-5 of FIG. 4 in a fifth embodiment of the present invention. The cross sectional view depicts an integrated circuit 802, such as a flip chip, mounted over a first side 808 of an interposer 804, such as laminated substrate.

The interposer 804 includes the first side 808 and a second side 814. The first side 808 can have interconnect contacts 810, device contacts 816, and test pads 812 exposed at the first side 808 of the interposer 804. The integrated circuit 802 can be connected to the device contacts 816 with electrical connectors 818, such as solder bumps or conductive bumps.

An encapsulation 844, such as an epoxy molding compound, can be over the interposer 804 and can cover the integrated circuit 802. The encapsulation 844 can function as a molded underfill between the integrated circuit 802 and the interposer 804 and around the electrical connectors 818.

A covering structure 852, such as a conformal shielding layer, can be over the encapsulation 844. The covering structure 852 can attach to the interposer 804 for grounding allowing the covering structure 852 to function as an electromagnetic interference (EMI) shield.

Figure 9:
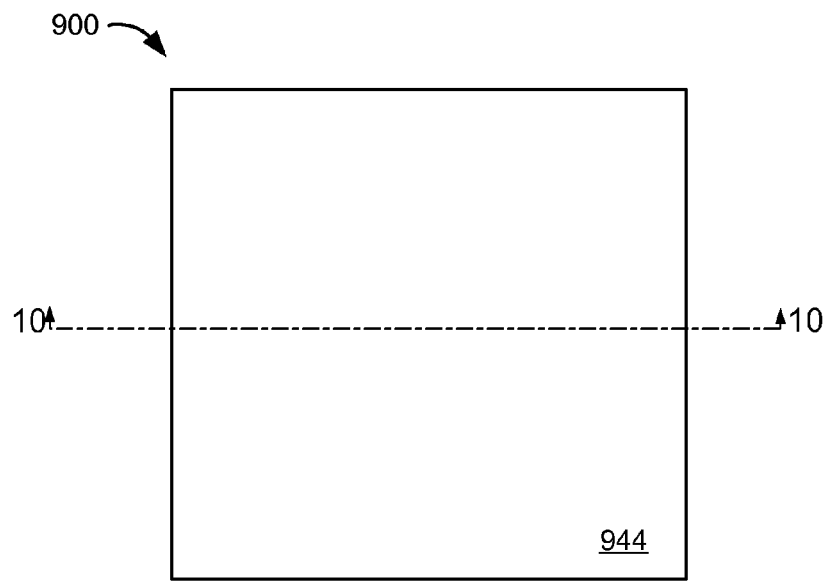
FIG. 9 is a top view of an integrated circuit package-in-package system with the integrated circuit packaging system of FIG. 1 in a sixth embodiment of the present invention.

Referring now to FIG. 9, therein is shown a top view of an integrated circuit package-in-package system 900 with the integrated circuit packaging system 100 of FIG. 1 in a sixth embodiment of the present invention. The integrated circuit package-in-package system 900 includes a package encapsulation 944, such as a cover including an epoxy molding compound.

For illustrative purposes, the integrated circuit package-in-package system 900 is shown with a square geometric shape, although it is understood that the shape of the integrated circuit package-in-package system 900 may be different. For example, the integrated circuit package-in-package system 900 can have a rectangular shape.

Figure 10:
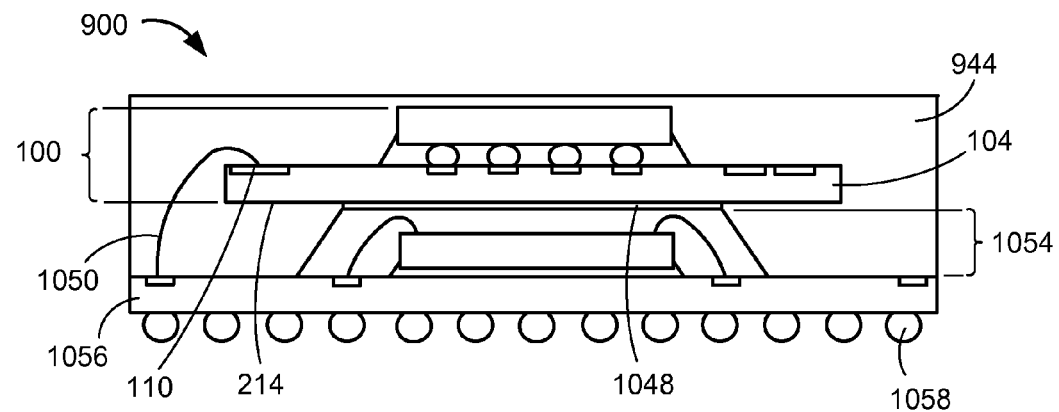
FIG. 10 is a cross-sectional view of the integrated circuit package-in-package system along line 10-10 of FIG. 9

Referring now to FIG. 10, therein is shown a cross-sectional view of the integrated circuit package-in-package system 900 along line 10-10 of FIG. 9. The cross-sectional view depicts the integrated circuit package-in-package system 900 having an integrated circuit device 1054, such as an encapsulated integrated circuit or encapsulated integrated circuits, over a carrier 1056, such as a laminated substrate.

The integrated circuit packaging system 100 can be over the integrated circuit device 1054 and the carrier 1056. An adhesive 1048, such as an adhesive film, can attach the second side 214 of the interposer 104 and the integrated circuit device 1054. Internal interconnects 1050, such as bond wires or ribbon bond wires, can connect the interconnect contacts 110 and the carrier 1056. The package encapsulation 944 can be over the carrier 1056 covering the integrated circuit packaging system 100, the integrated circuit device 1054, the adhesive 1048, and the internal interconnects 1050.

External interconnects 1058, such as solder balls, can connect to the carrier 1056 on a side opposite the integrated circuit device 1054. The external interconnects 1058 connect to the next system level (not shown), such as printed circuit board or another integrated circuit packaging system.

Figure 11:
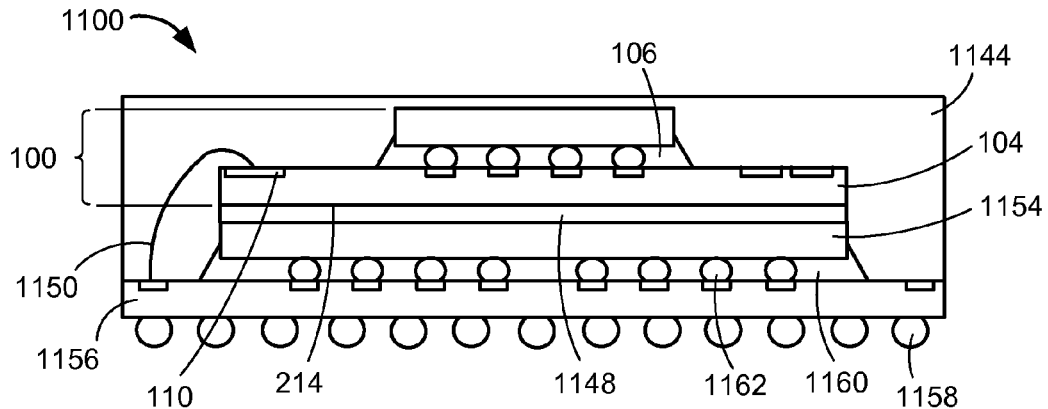
FIG. 11 is a cross-sectional view of an integrated circuit package-in-package system with integrated circuit packaging system of FIG. 1 along line 10-10 of FIG. 9 in a seventh embodiment of the present invention.

Referring now to FIG. 11, therein is shown a cross-sectional view of an integrated circuit package-in-package system 1100 with the integrated circuit packaging system 100 of FIG. 1 along line 10-10 of FIG. 9 in a seventh embodiment of the present invention. The cross-sectional view depicts the integrated circuit package-in-package system 1100 having an integrated circuit device 1154, such as a flip chip, over a carrier 1156, such as a laminated substrate.

An underfill support 1160 can be between the integrated circuit device 1154 and the carrier 1156. The underfill support 1160 can be of the same material as the underfill 106 of the integrated circuit packaging system 100. The underfill support 1160 can surround and provide structural support to device interconnects 1162, such as solder bumps or conductive bumps, of the integrated circuit device 1154. The device interconnects 1162 can connect the integrated circuit device 1154 and the carrier 1156.

The integrated circuit packaging system 100 can be over the integrated circuit device 1154 and the carrier 1156. An adhesive 1148, such as an adhesive film, can attach the second side 214 of the interposer 104 and the integrated circuit device 1154. Internal interconnects 1150, such as bond wires or ribbon bond wires, can connect the interconnect contacts 110 and the carrier 1156. A package encapsulation 1144, such as a cover including an epoxy molding compound, can be over the carrier 1156 covering the integrated circuit packaging system 100, the integrated circuit device 1154, and the internal interconnects 1150.

External interconnects 1158, such as solder balls, can connect to the carrier 1156 on a side opposite the integrated circuit device 1154. The external interconnects 1158 connect to the next system level (not shown), such as printed circuit board or another integrated circuit packaging system.

Figure 12:
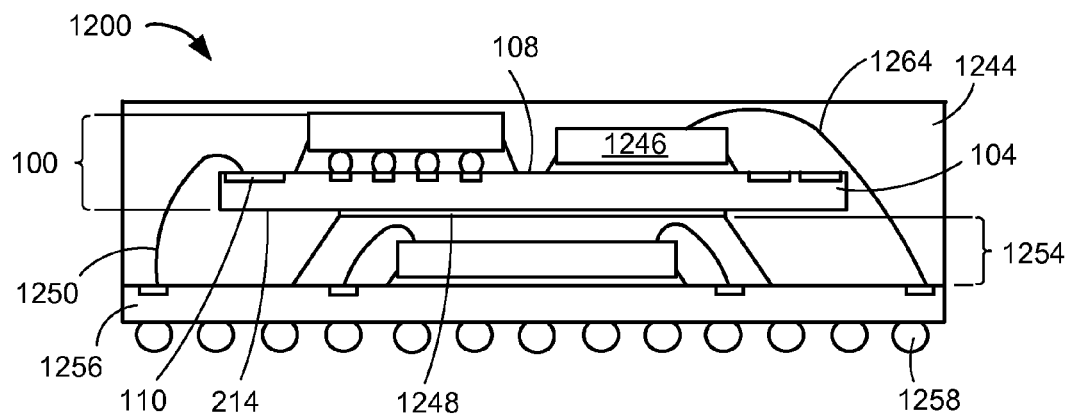
FIG. 12 is a cross-sectional view of an integrated circuit package-in-package system with the integrated circuit packaging system of FIG. 1 along line 10-10 of FIG. 9 in an eighth embodiment of the present invention.

Referring now to FIG. 12, therein is shown a cross-sectional view of an integrated circuit package-in-package system 1200 with the integrated circuit packaging system 100 of FIG. 1 along line 10-10 of FIG. 9 in an eighth embodiment of the present invention. The cross-sectional view depicts the integrated circuit package-in-package system 1200 having an integrated circuit device 1254, such as an encapsulated integrated circuit or encapsulated integrated circuits, over a carrier 1256, such as a laminated substrate.

The integrated circuit packaging system 100 can be over the integrated circuit device 1254 and the carrier 1256. An adhesive 1248, such as an adhesive film, can attach the second side 214 of the interposer 104 and the integrated circuit device 1254.

A device 1246, such as an integrated circuit die, can be attached to the first side 108 of the interposer 104. Electrical interconnects 1264, such as bond wires or ribbon bond wires, can connect the device 1246 and the carrier 1256.

Internal interconnects 1250, such as bond wires or ribbon bond wires, can connect the interconnect contacts 110 and the carrier 1256. A package encapsulation 1244, such as a cover including epoxy molding compound, can be over the carrier 1256 covering the integrated circuit packaging system 100, the integrated circuit device 1254, the device 1246, the electrical interconnects 1264, and the internal interconnects 1250.

External interconnects 1258, such as solder balls, can connect to the carrier 1256 on a side opposite the integrated circuit device 1254. The external interconnects 1258 connect to the next system level (not shown), such as printed circuit board or another integrated circuit packaging system.

Figure 13:
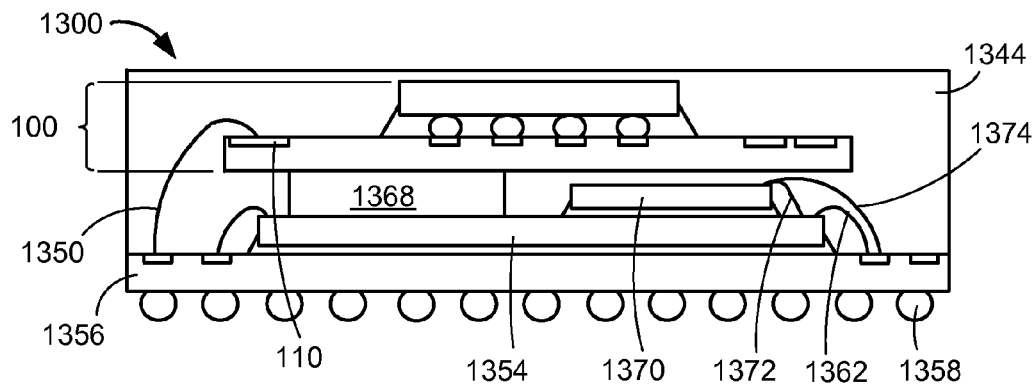
FIG. 13 is a cross-sectional view of an integrated circuit package-in-package system with the integrated circuit packaging system of FIG. 1 along line 10-10 of FIG. 9 in a ninth embodiment of the present invention.

Referring now to FIG. 13, therein is shown a cross-sectional view of an integrated circuit package-in-package system 1300 with the integrated circuit packaging system 100 of FIG. 1 along line 10-10 of FIG. 9 in a ninth embodiment of the present invention. The cross-sectional view depicts the integrated circuit package-in-package system 1300 having an integrated circuit device 1354, such as an integrated circuit die, over a carrier 1356, such as a laminated substrate. Device interconnects 1362, such as bond wires or ribbon bond wires, can connect the integrated circuit device 1354 and the carrier 1356.

A spacer 1368, such as a wire-in-film spacer or an adhesive spacer, can be over the integrated circuit device 1354. An intra-stack circuit 1370, such as an integrated circuit die, can also be mounted over the integrated circuit device 1354. The intra-stack circuit 1370 can be adjacent to the spacer 1368.

First intra-stack interconnects 1372, such as bond wires or ribbon bond wires, can connect the intra-stack circuit 1370 and the integrated circuit device 1354. Second intra-stack interconnects 1374, such as bond wires or ribbon bond wires, can connect the intra-stack circuit 1370 and the carrier 1356.

The integrated circuit packaging system 100 can be over the intra-stack circuit 1370 and the spacer 1368. Internal interconnects 1350, such as bond wires or ribbon bond wires, can connect the interconnect contacts 110 and the carrier 1356. A package encapsulation 1344, such as a cover including an epoxy molding compound, can be over the carrier 1356 covering the integrated circuit packaging system 100, the integrated circuit device 1354, the internal interconnects 1350, the intra-stack circuit 1370, the first intra-stack interconnects 1372, the second intra-stack interconnects 1374, and the spacer 1368.

External interconnects 1358, such as solder balls, can connect to the carrier 1356 on a side opposite the integrated circuit device 1354. The external interconnects 1358 connect to the next system level (not shown), such as printed circuit board or another integrated circuit packaging system.

Figure 14:
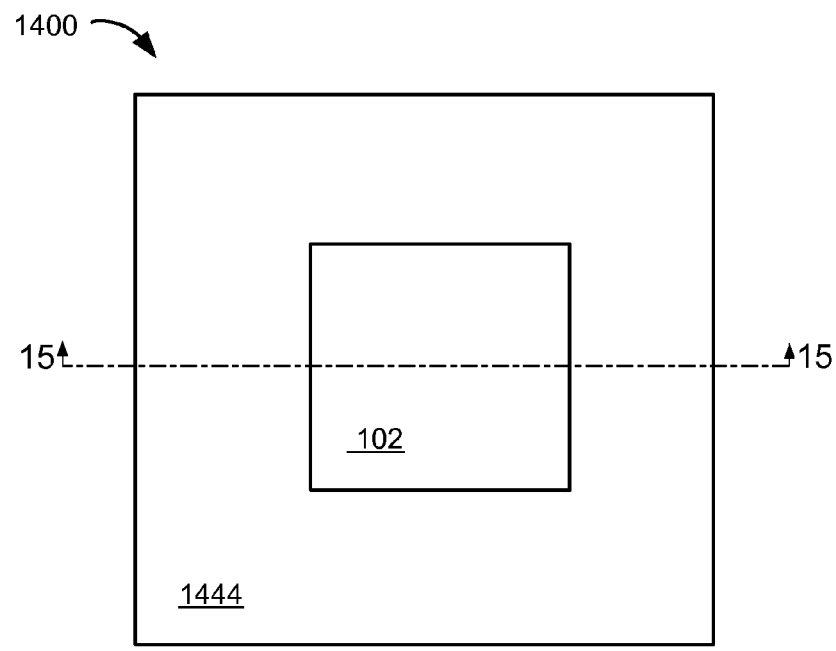
FIG. 14 is a top view of an integrated circuit package-in-package system with the integrated circuit packaging system of FIG. 1 in a tenth embodiment of the present invention.

Referring now to FIG. 14, therein is shown a top view of an integrated circuit package-in-package system 1400 with the integrated circuit packaging system 100 of FIG. 1 in a tenth embodiment of the present invention. The top view depicts a package encapsulation 1444, such as an epoxy molding compound, with the integrated circuit 102 exposed by the package encapsulation 1444.

For illustrative purposes, the integrated circuit package-in-package system 1400 is shown with a square geometric shape, although it is understood that the shape of the integrated circuit package-in-package system 1400 may be different, such as rectangular or a geometric shape that is not a square.

Figure 15:
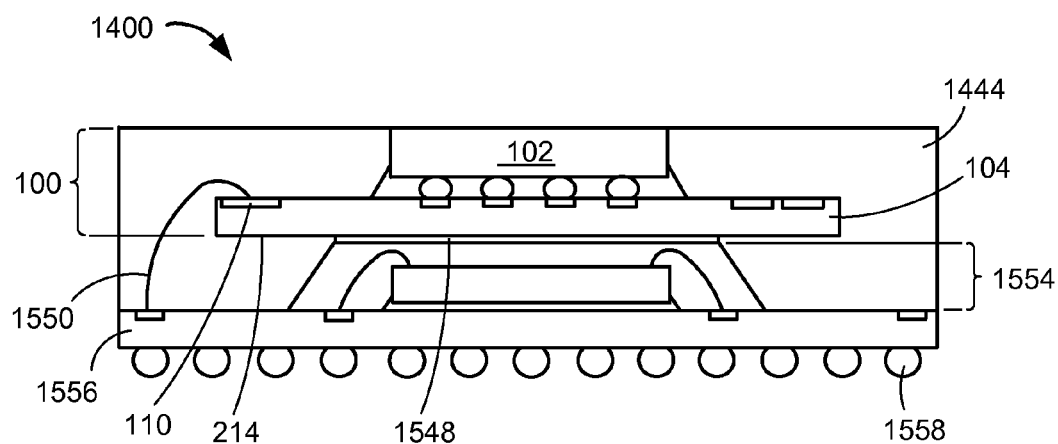
FIG. 15 is a cross-sectional view of the integrated circuit package-in-package system along line 15-15 of FIG. 14.

Referring now to FIG. 15, therein is shown a cross-sectional view of the integrated circuit package-in-package system 1400 along line 15-15 of FIG. 14. The cross-sectional view depicts the integrated circuit package-in-package system 1400 having an integrated circuit device 1554, such as an encapsulated integrated circuit or encapsulated integrated circuits, over a carrier 1556, such as a laminated substrate.

The integrated circuit packaging system 100 can be over the integrated circuit device 1554 and the carrier 1556. An adhesive 1548, such as an adhesive film, can attach the second side 214 of the interposer 104 and the integrated circuit device 1554. Internal interconnects 1550, such as bond wires or ribbon bond wires, can connect the interconnect contacts 110 and the carrier 1556. The package encapsulation 1444 can be over the carrier 1556 covering the integrated circuit packaging system 100, the integrated circuit device 1554, and the internal interconnects 1550. The package encapsulation 1444 can expose the integrated circuit 102 and can be coplanar with the exposed portion of the integrated circuit 102.

External interconnects 1558, such as solder balls, can connect to the carrier 1556 on a side opposite the integrated circuit device 1554. The external interconnects 1558 connect to the next system level (not shown), such as printed circuit board or another integrated circuit packaging system.

Figure 16:
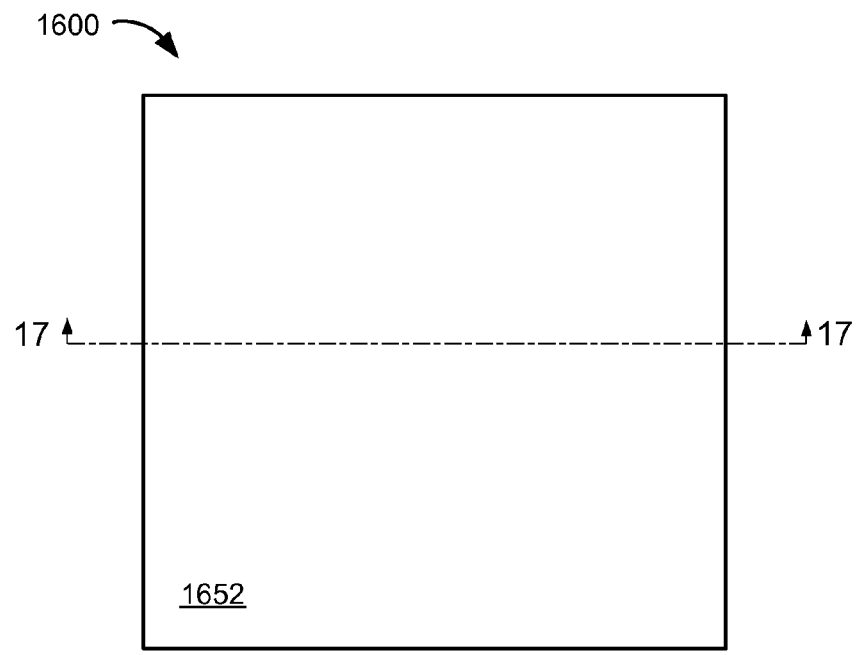
FIG. 16 is a top view of an integrated circuit package-in-package system with the integrated circuit packaging system of FIG. 1 in a eleventh embodiment of the present invention.

Referring now to FIG. 16, therein is shown a top view of an integrated circuit package-in-package system 1600 with the integrated circuit packaging system 100 of FIG. 1 in a eleventh embodiment of the present invention. The top view depicts a conductive structure 1652, such as a heat spreader.

For illustrative purposes, the integrated circuit package-in-package system 1600 is shown with a square geometric shape, although it is understood that the shape of the integrated circuit package-in-package system 1600 may be different. For example, the integrated circuit package-in-package system 1600 can have a rectangular shape.

Figure 17:
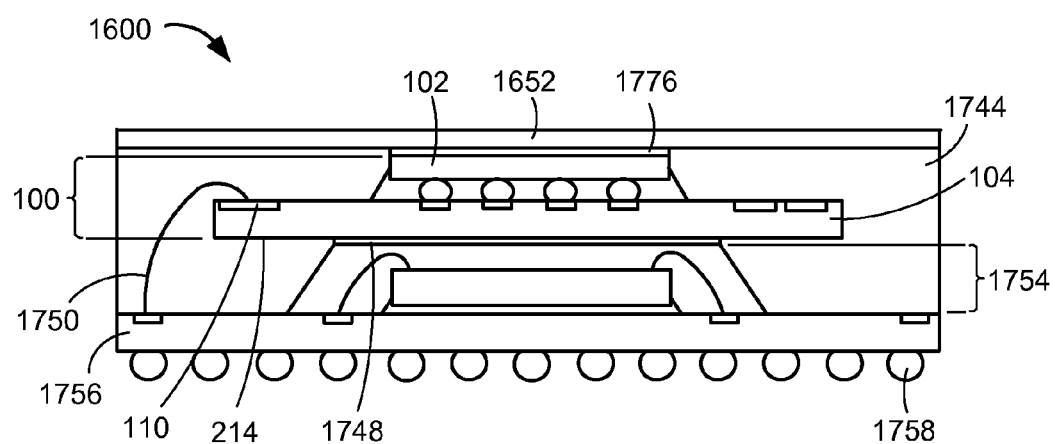
FIG. 17 is a cross-sectional view of the integrated circuit package-in-package system along line 17-17 of FIG. 16

Referring now to FIG. 17, therein is shown a cross-sectional view of the integrated circuit package-in-package system 1600 along line 17-17 of FIG. 16. The cross-sectional view depicts the integrated circuit package-in-package system 1600 having an integrated circuit device 1754, such as an encapsulated integrated circuit or encapsulated integrated circuits, over a carrier 1756, such as a laminated substrate.

The integrated circuit packaging system 100 can be over the integrated circuit device 1754 and the carrier 1756. An adhesive 1748, such as an adhesive film, can attach the second side 214 of the interposer 104 and the integrated circuit device 1754. Internal interconnects 1750, such as bond wires or ribbon bond wires, can connect the interconnect contacts 110 and the carrier 1756. A package encapsulation 1744, such as an epoxy molding compound, can be over the carrier 1756 covering the integrated circuit packaging system 100, the integrated circuit device 1754, and the internal interconnects 1750.

The conductive structure 1652 can be over the package encapsulation 1744. The conductive structure 1652 can attached to the integrated circuit 102 with an adhesive structure 1776, such as a thermal adhesive or a thermal film.

External interconnects 1758, such as solder balls, can connect to the carrier 1756 on a side opposite the integrated circuit device 1754. The external interconnects 1758 connect to the next system level (not shown), such as printed circuit board or another integrated circuit packaging system.

Figure 18:
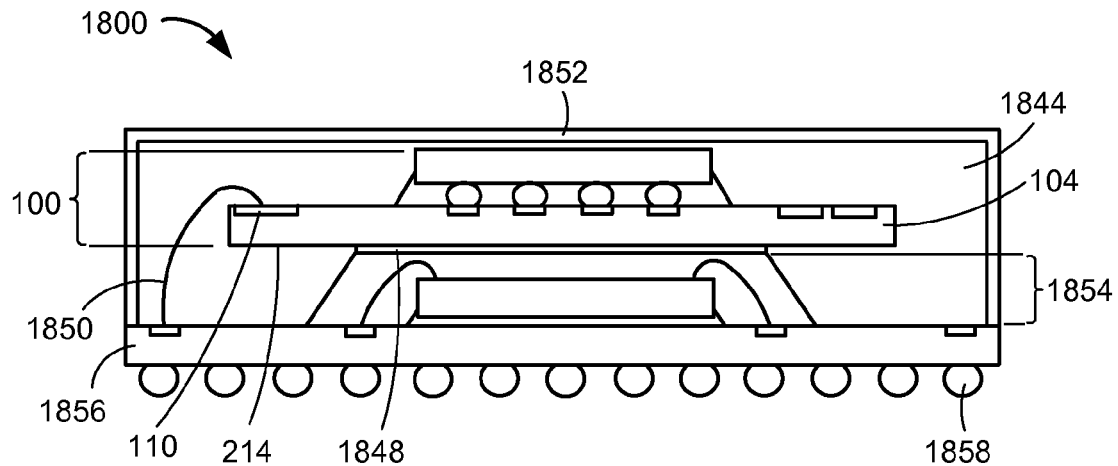
FIG. 18 is a cross-sectional view of an integrated circuit package-in-package system with the integrated circuit packaging system of FIG. 1 along line 17-17 of FIG. 16 in a twelfth embodiment of the present invention.

Referring now to FIG. 18 therein is shown a cross-sectional view of an integrated circuit package-in-package system 1800 with the integrated circuit packaging system 100 of FIG. 1 along line of 17-17 of FIG. 16 in a twelfth embodiment of the present invention. The cross-sectional view depicts the integrated circuit package-in-package system 1800 having an integrated circuit device 1854, such as an encapsulated integrated circuit or encapsulated integrated circuits, over a carrier 1856, such as a laminated substrate.

The integrated circuit packaging system 100 can be over the integrated circuit device 1854 and the carrier 1856. An adhesive 1848, such as an adhesive film, can attach the second side 214 of the interposer 104 and the integrated circuit device 1854. Internal interconnects 1850, such as bond wires or ribbon bond wires, can connect the interconnect contacts 110 and the carrier 1856. A package encapsulation 1844 can be over the carrier 1856 covering the integrated circuit packaging system 100, the integrated circuit device 1854, and the internal interconnects 1850.

A conductive structure 1852, such as a conformal shielding layer, can be over the package encapsulation 1844. The conductive structure 1852 can attach the carrier 1856 for grounding allowing the conductive structure 1852 to function as an electromagnetic interference (EMI) shield.

External interconnects 1858, such as solder balls, can connect to the carrier 1856 on a side opposite the integrated circuit device 1854. The external interconnects 1858 connect to the next system level (not shown), such as printed circuit board or another integrated circuit packaging system.

Figure 19:
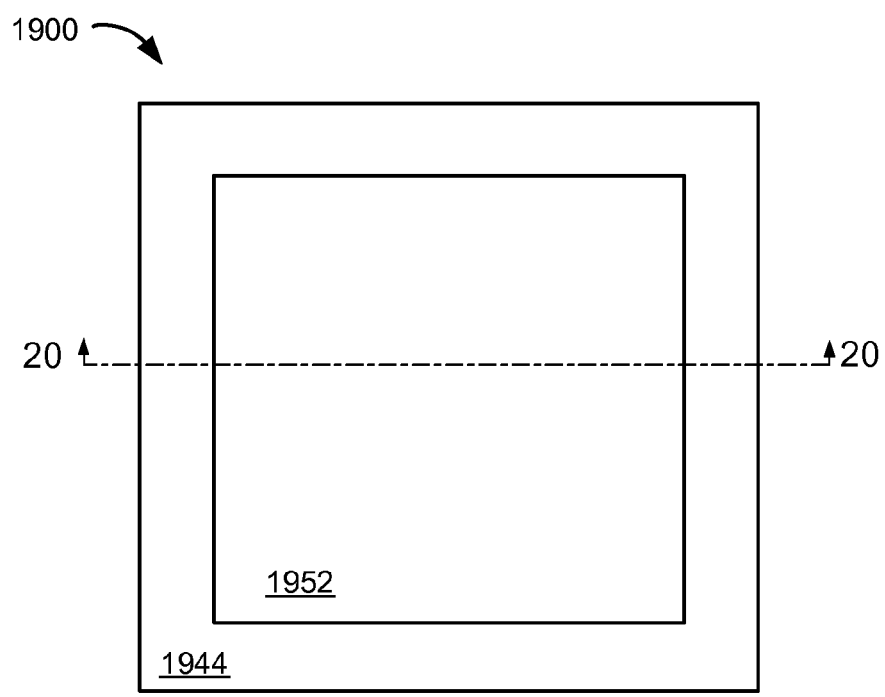
FIG. 19 is a top view of an integrated circuit package-in-package system with the integrated circuit packaging system of FIG. 1 in a thirteenth embodiment of the present invention.

Referring now to FIG. 19, therein is shown a top view of an integrated circuit package-in-package system 1900 with the integrated circuit packaging system 100 of FIG. 1 in a thirteenth embodiment of the present invention. The top view depicts a package encapsulation 1944, such as an epoxy molding compound. The package encapsulation 1944 can expose a conductive structure 1952, such as an electromagnetic interference (EMI) shield.

Figure 20:
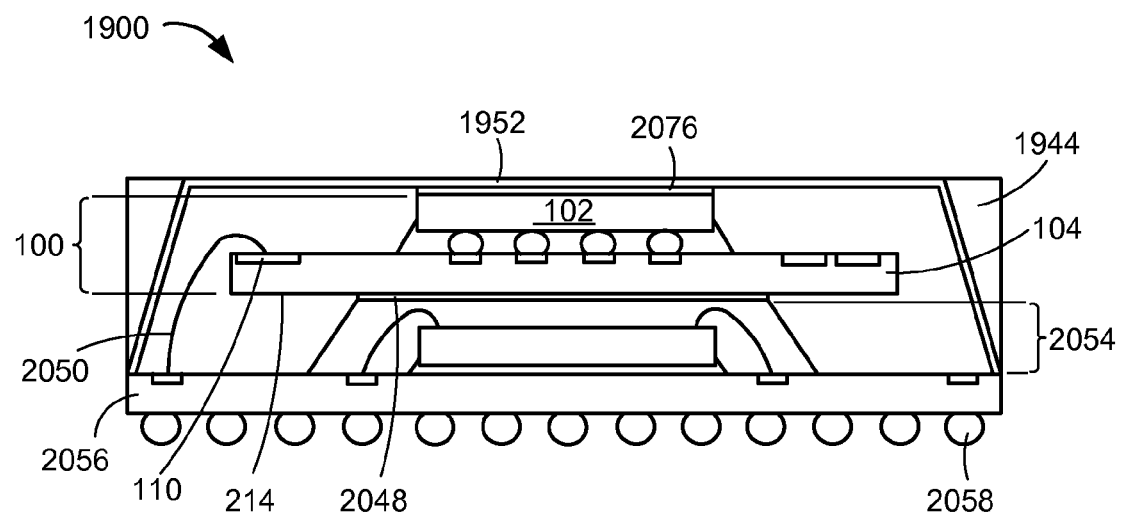
FIG. 20 is a cross-sectional view of the integrated circuit package-in-package system along line 20-20 of FIG. 19.

Referring now to FIG. 20, therein is shown a cross-sectional view of the integrated circuit package-in-package system 1900 along line 20-20 of FIG. 19. The cross-sectional view depicts the integrated circuit package-in-package system 1900 having an integrated circuit device 2054, such as an encapsulated integrated circuit or encapsulated integrated circuits, over a carrier 2056, such as a laminated substrate.

The integrated circuit packaging system 100 can be over the integrated circuit device 2054 and the carrier 2056. An adhesive 2048, such as an adhesive film, can attach the second side 214 of the interposer 104 and the integrated circuit device 2054. Internal interconnects 2050, such as bond wires or ribbon bond wires, can connect the interconnect contacts 110 and the carrier 2056.

The conductive structure 1952, such as a shield cage, can be over the integrated circuit packaging system 100. The integrated circuit 102 can attached to the conductive structure 1952 with an adhesive structure 2076, such as a conductive adhesive or a conductive film. The conductive structure 1952 can attach the carrier 2056 for grounding allowing the conductive structure 1952 to function as an electromagnetic interference (EMI) shield.

The package encapsulation 1944 can be over the carrier 2056 covering the integrated circuit packaging system 100, the integrated circuit device 2054, the conductive structure 1952, and the internal interconnects 2050. The package encapsulation 1944 can expose the conductive structure 1952.

External interconnects 2058, such as solder balls, can connect to the carrier 2056 on a side opposite the integrated circuit device 2054. The external interconnects 2058 connect to the next system level (not shown), such as printed circuit board or another integrated circuit packaging system.

Figure 21:
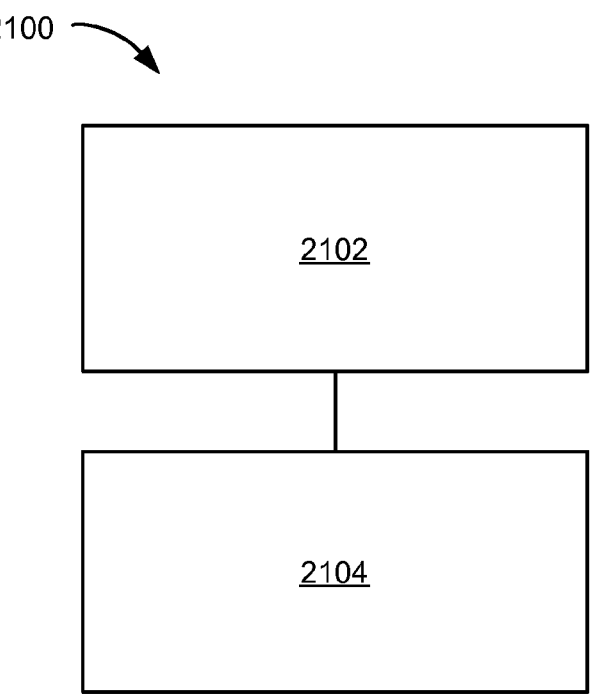
FIG. 21 is a flow chart of a method of manufacture of an integrated circuit packaging system in a further embodiment of the present invention.

Referring now to FIG. 21, therein is shown a flow chart of a method 2100 of manufacture of the integrated circuit packaging system 100 in a further embodiment of the present invention. The method 2100 includes providing an interposer having device contacts, interconnect contacts, and test pads including the interconnect contacts along an interconnect perimeter region of the interposer, the device contacts at a device perimeter region of the interposer with the device perimeter region within the interior of the interconnect perimeter region, and the test pads at a test perimeter region of the interposer with the test perimeter region encompassing a device perimeter region in block 2102; and mounting an integrated circuit over device contacts in block 2104.

Yet other important aspects of the embodiments include that it valuably supports and services the historical trend of reducing costs, simplifying systems, and increasing performance.

These and other valuable aspects of the embodiments consequently further the state of the technology to at least the next level.

Thus, it has been discovered that the integrated circuit packaging system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto set forth herein or shown in the accompanying drawings are to be interpreted in an illustrative and non-limiting sense.

What is claimed is:

1. A method of manufacturing for an integrated circuit packaging system comprising:
    providing an interposer having device contacts, interconnect contacts, and test pads including:

the interconnect contacts along an interconnect perimeter region of the interposer, the device contacts at a device perimeter region of the interposer with the device perimeter region within the interior of the interconnect perimeter region, and the test pads at a test perimeter region of the interposer with the test perimeter region encompassing the device perimeter region;

mounting an integrated circuit over the device contacts; and providing terminal embedded interconnects, having a first region and a second region, connecting the interconnect contacts and the device contacts;

providing the first region having a first density of the terminal embedded interconnects; and providing the second region having a second density of the terminal embedded interconnects with the first density greater than the second density and the terminal embedded interconnects in the second region connected to the device contacts.

2. The method as claimed in claim 1 wherein providing the interposer includes:

providing an equal number of interconnect sites, device sites, and test sites for the interconnect contacts, the device contacts and the test pads, respectively; and providing at least a portion of the interconnect sites, the device sites, and the test sites populated with the interconnect contacts, the device contacts and the test pads, respectively.

3. The method as claimed in claim 1 wherein providing the interposer having the device contacts, the interconnect contacts, and the test pads includes providing test embedded interconnects between the device contacts and the test pads with the test embedded interconnects fanning out from the device perimeter region to the test perimeter region.

4. The method as claimed in claim 1 wherein providing the interposer includes the interconnect contacts, the device contacts, and the test pads exposed on a first side.

5. An integrated circuit packaging system comprising:

an interposer having device contacts, interconnect contacts, and test pads including:

the interconnect contacts along an interconnect perimeter region of the interposer, the device contacts at a device perimeter region of the interposer with the device perimeter region within the interior of the interconnect perimeter region, and the test pads at a test perimeter region of the interposer with the test perimeter region encompassing the device perimeter region;

an integrated circuit over the device contacts; and wherein the interposer having the device contacts, the interconnect contacts, and the test pads includes:

terminal embedded interconnects, having a first region and a second region, connected between the interconnect contacts and the device contacts;

the first region having a first density of the terminal embedded interconnects; and the second region having a second density of the terminal embedded interconnects with the first density greater than the second density and the second region is connected to the rows of device contacts.

6. The system as claimed in claim 5 wherein the interposer includes:

an equal number of interconnect sites, device sites, and test sites for the interconnect contacts, the device contacts and the test pads, respectively; and at least a portion of the interconnect sites, the device sites, and the test sites are populated with the interconnect contacts, the device contacts and the test pads, respectively.

7. The system as claimed in claim 5 wherein the interposer having the device contacts, the interconnect contacts, and the test pads includes test embedded interconnects between the device contacts and the test pads with the test embedded interconnects fanning out from the device perimeter region to the test perimeter region.

8. The system as claimed in claim 5 wherein the interposer includes the interconnect pads, the device contacts and the test pads exposed on a first side.

9. The system as claimed in claim 5 wherein:

the device perimeter region includes rows of device contacts; and the test perimeter region includes rows of test pads.

10. The system as claimed in claim 9 further comprising a covering structure over the integrated circuit with the interconnect contacts and the test pads exposed.

11. The system as claimed in claim 9 further comprising:

an encapsulation over the integrated circuit; and a conductive structure over or exposed from the encapsulation.

12. The system as claimed in claim 9 further comprising:

a carrier;

an integrated circuit device over the carrier;

a package encapsulation over the carrier covering at least a portion of the integrated circuit, the interposer, and the integrated circuit device; and wherein:

the interposer is over the integrated circuit device; and the interconnect contacts are connected to the carrier.

13. The system as claimed in claim 9 wherein:

the integrated circuit includes a flip chip; and further comprising:

an underfill between the flip chip and the interposer.

* * * * *